United States Patent [19]
Abraham

[11] 3,996,484
[45] Dec. 7, 1976

[54] INTERACTIVE NEGATIVE RESISTANCE MULTIPLE-STABLE STATE DEVICE

[75] Inventor: George Abraham, Washington, D.C.

[73] Assignee: The United States of America as represented by the Secretary of the Navy, Washington, D.C.

[22] Filed: Sept. 5, 1975

[21] Appl. No.: 610,820

[52] U.S. Cl. .............................. 307/322; 307/286; 357/12; 357/76

[51] Int. Cl.² ......................................... H03K 3/31

[58] Field of Search .......... 307/286, 287, 322, 324; 357/12, 76

[56] References Cited

UNITED STATES PATENTS

| | | | |
|---|---|---|---|
| 2,614,140 | 10/1952 | Kreer | 307/286 |
| 3,027,464 | 3/1962 | Kosonocky | 307/286 X |
| 3,053,998 | 9/1962 | Chynoweth et al. | 307/286 X |
| 3,062,971 | 11/1962 | Wallace | 307/286 X |
| 3,075,087 | 1/1963 | Lo | 307/286 X |

Primary Examiner—John S. Heyman
Attorney, Agent, or Firm—R. S. Sciascia; Philip Schneider; Norman Brown

[57] ABSTRACT

Devices exhibiting negative-resistance characteristics are adjusted and interconnected to form a composite device in a manner to permit negative-resistance regions of each device to cooperatively interact to provide additional stable states in excess of the number of stable states exhibited by the composite device not operating in a negative-resistance interactive mode. A minimum number of $(M+1)+[(M-1)!]$ stable states can be achieved by combining M negative-resistance devices to operate in an interactive manner.

11 Claims, 12 Drawing Figures

NEGATIVE RESISTANCE REGIONS PARTIALLY OVERLAPPING

NEGATIVE RESISTANCE REGIONS FULLY OVERLAPPING

$Q_{11}, Q_{12} = 2N67$ $R_{13}, R_{14} = 50$ $R_{11}, R_{12} =$ VARIABLE (ABOUT 7,000Ω)

$R_{15} =$ VARIABLE (ABOUT 2K)

INTERACTIVE NEGATIVE RESISTANCE MULTIPLE-STABLE STATE DEVICE

BACKGROUND OF THE INVENTION

The present invention relates to negative-resistance devices, and more particularly to interactive negative-resistance multistate devices.

Negative resistance devices have been of fundamental importance in the development of electronic apparatus of all types, and have long been the subject of both mathematical and experimental investigations.

There are basically two types of negative-resistance devices, categorized by the voltage-current behavior they exhibit. When voltage (ordinate) across the device is plotted as a function of current (abscissa) through the device, the first type exhibits a characteristic which is generally in the shape of an S. This class of device is also known as the short-circuit stable, or voltage-controlled type. The other type exhibits a characteristic generally shaped as an N, giving rise to the name N type-device. These N-type devices are also known as open-circuit stable, or current-controlled device.

Many negative-resistance devices exist in each category of devices. The S-type devices include, for example, the Hole Storage Transistor, the Tunnel Diode, and the Dynatron. Devices such as the Amorphous Semiconductor Diode, the Transitron, and the Avalanche Diode are all examples of N-type devices. It is well known that the negative-resistance mechanism of each of these devices is attributable to a different physical phenomena.

One particularly important and well known aspect of negative-resistance devices is that they may be connected together to form a composite device having multiple stable states. In fact, it has been shown that by combining a number M of these negative-resistance devices, a number of (M+1) stable states can be achieved. The existence of more then two (i.e., binary) stable states in a device is obviously important in many electronic applications, for example, a computer memory or logic. A device having four stable states rather than just two stable states clearly will store more information or can be used to process data more quickly and with fewer devices at lower cost and volume with increased reliability.

Arrangements and interconnection of negative-resistance devices to yield a multistate stable device are known to persons skilled in the electronic art. I discuss these negative-resistance devices in previous patents issued to me (including U.S. Pat. Nos. 3,333,196; 3,293,453; 3,089,039; 3,200,266; 3,184,602; 2,939,965). For example, in my U.S. Pat. No. 3,089,039, I disclose a multistable circuit which employs a plurality of negative-resistance devices (each exhibiting a short-circuit-stable negative-resistance characteristic) connected in series to give a composite multistable characteristic. In my article entitled "Variable Radix Multistable Integrated Circuits" published in the September, 1974 issue of "COMPUTER", by the IEEE Computer Society of the Institute of Electrical and Electronics Engineers, hereby incorporated by reference, I have described in experimental and mathematical terms both the theory and operation of these multistable devices resulting from interconnection of noninteracting negtive-resistance devices.

Obviously, providing a way of interconnecting these negative-resistance devices in a manner to achieve additional stable states would be highly desirable. Negative-resistance devices have been well-known for many years; more recently, it has been commonly accepted that a combination of M devices to form a multistate stable device will produce at most M + 1 multistate stable stages. The present invention is intended to change that state of affairs, and to provide a multistate stable device by interconnecting the M negative-resistance devices to produce a minimum (M+1)+[(M−1)!] stable states—thus yielding an additional [(M−1)!] stable states.

SUMMARY OF THE INVENTION

The present invention is a technique for combining number M of negative-resistance devices to form a composite device having a minimum of (M+1)+[(M−1)!] multistable states. In this technique, M negative-resistance devices are interconnected in a manner such that their negative-resistance regions overlap. In implementing this technique, it may be necessary to modify the device characteristic by adding resistance in parallel and/or in series with it so that the negative-resistance devices utilized will possess the desired overlapping negative-resistance characteristics.

It is therefore an object of the present invention to provide a device having multiple stable states;

It is a further object of the present invention to provide a composite device utilizing a number M of negative-resistance devices, which when combined provide a minimum of (M+1) +[(M−1)!] stable states;

It is a still further object of the present invention to provide a minimum [(M−1)!] additional stable states to a group of M negative-resistance region devices;

Other objects, advantages and novel features of the invention will become apparent from the following detailed description of the invention when considered in conjunction with the accompanying drawings wherein:

DETAILED DESCRIPTION OF THE INVENTION

Figure 2:
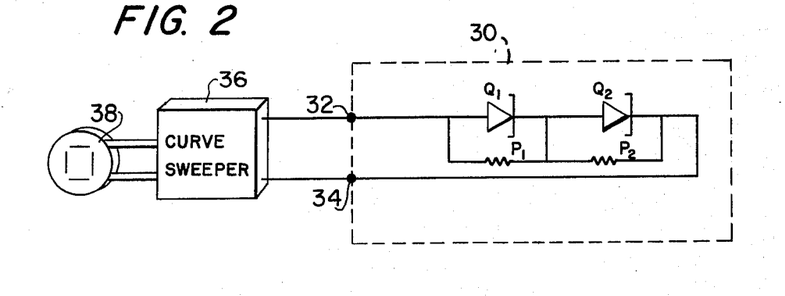
FIG. 2 indicates in black diagram-schematic fashion interconnection of two S-type negative-resistance devices and apparatus for obtaining their composite characteristic curve.

FIG. 2 depicts a composite negative-resistance device 30 formed by two elemental negative-resistance devices, $Q_1$, $Q_2$ both of S-type, connected in series with resistors $R_1$ and $R_2$ respectively connected across each device. Composite device terminals 32, 34 are coupled to either end of the series arrangement.

Figure 3A:
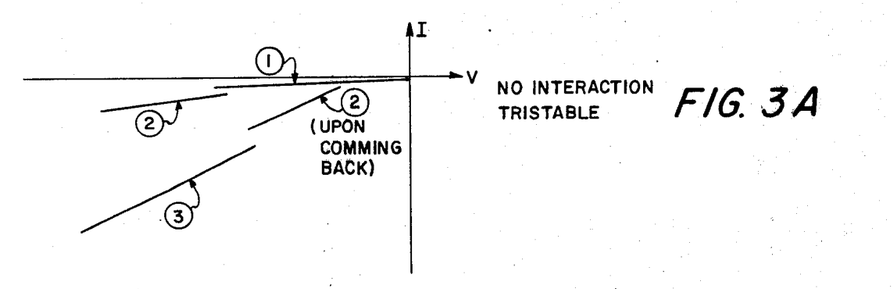
FIG. 3a indicates in graphical fashion tristable non-interactive states of the composite S-type device depicted in FIG. 2.
Figure 3B:
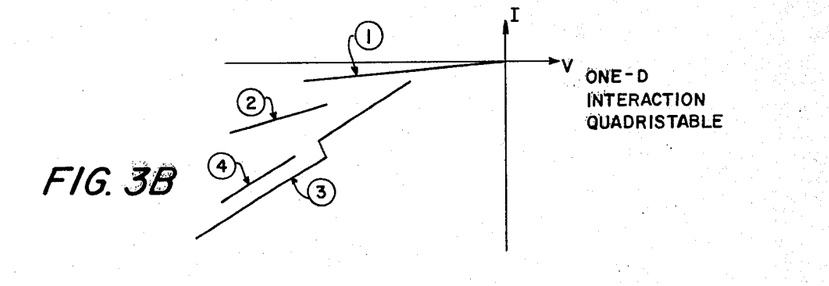
FIG. 3b indicates in a graphical fashion quadristable, interactive states of the composite S-type device depicted in FIG. 2 in accordance with the technique of the present invention.

A curve sweeper 36 is connected to device terminals 32, 34 and has a display 38. The curve tracer 36 applies and varies a selected independent variable (current for S-type device; voltage for N-type devices) and displays a representation of both the applied independent variable and the dependent variable (voltage for S-type devices; current for N-type devices). In this manner a set of operating characteristics are obtained for the composite device 30. In FIG. 3a, three stable states denoted as 1, 2, 3 (the maximum previously expected by those skilled in the art from two negative resistance devices) are obtained in a non-interacting manner. When the two elemental devices are adjusted in accordance with the technique of the present invention to interact (one interaction, an additional previously unexpected stable state (labeled 4) obtains, thus yielding the four stable states depicted in FIG. 3b. It should be noted that FIGS. 3a and 3b are graphic representations of photographs of the operating characteristics as displayed by display device 38.

Figure 5:
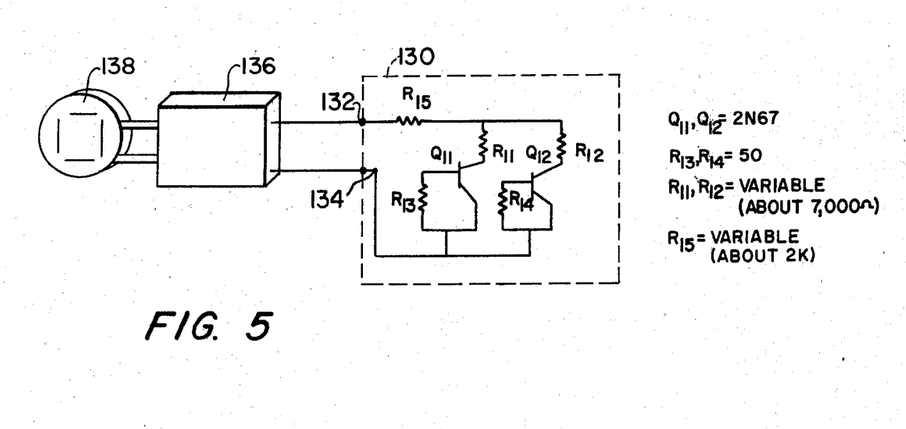
FIG. 5 indicates in block diagram-schematic fashion interconnection of two N-type negative resistance devices and apparatus for obtaining their composite characteristic curve.

FIG. 5 depicts a composite negative-resistance device 130 formed by two elemental negative-resistance devices $Q_{11}$, $Q_{12}$, both of S-type, with resistors $R_{11}$ and $R_{12}$ respectively connected in series with their emitters. The other terminal of resistors $R_{11}$, $R_{12}$ are connected in series with a resistor $R_{15}$ to a first composite device terminal 132. The base terminal of each device $Q_{11}$, $Q_{12}$ is connected through respective resistors $R_{13}$, $R_{14}$ to a second composite device terminal 134. The collectors of both devices $Q_{11}$, $Q_{12}$ are also connected to terminal 134.

Figure 6A:
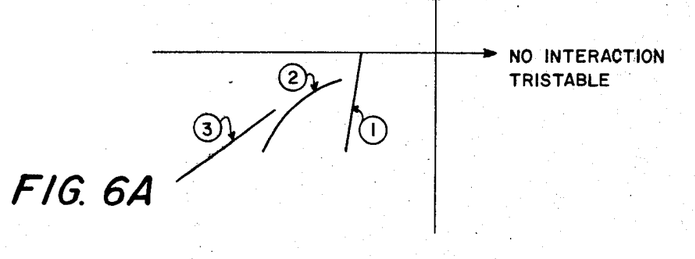
FIG. 6a indicates in graphical fashion tristable non-interactive states of the composite N-type device depicted in FIG. 5.
Figure 6B:
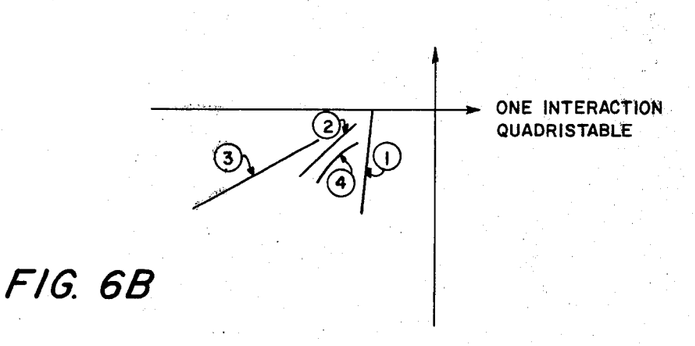
FIG. 6b indicates in a graphical fashion quadristable, interactive states of the composite N-type device depicted in FIG. 5 in accordance with the technique of the present invention.

A curve sweeper 136 is connected to device terminals 132, 134 and has a display 138. The curve tracer 136 applies and varies a selected independent variable (current for S-type device; voltage for N-type devices) and displays a representation of both the applied independent variable and the dependent variable (voltage for S-type devices; current for N-type devices). In this manner a set of operating characteristics are obtained for the composite device 130. In FIG. 6a, three stable states denoted as 1, 2, 3 (the maximum previously expected by those skilled in the art from two negative-resistance devices) are obtained in a non-interacting manner. When the two elemental devices are adjusted in accordance with the technique of the present invention to interact (one interaction), an additional previously unexpected stable state (labeled 4) obtains, thus yielding the four stable states depicted in FIG. 6b. It should be noted that FIGS. 6a and 6b are graphic representations of photographs of the operating characteristics as displayed by display device 138.

The technique of the present invention relates primarily to interconnecting individual elemental devices in a manner so that their behavior is interactive in a specific manner. This necessary specific operative interaction can be best understood by employing a technique well known in the electronics art commonly known as "load-line analysis" (i.e. graphical analysis of the nonlinear device characteristic and its nonlinear or linear load). Any elemental device having a negative-resistance region is a useful candidate for combining with similar-type devices operating by the same mechanism in order to obtain advantages of a composite device constructed in accordance with the principles of my invention.

Figure 1A:
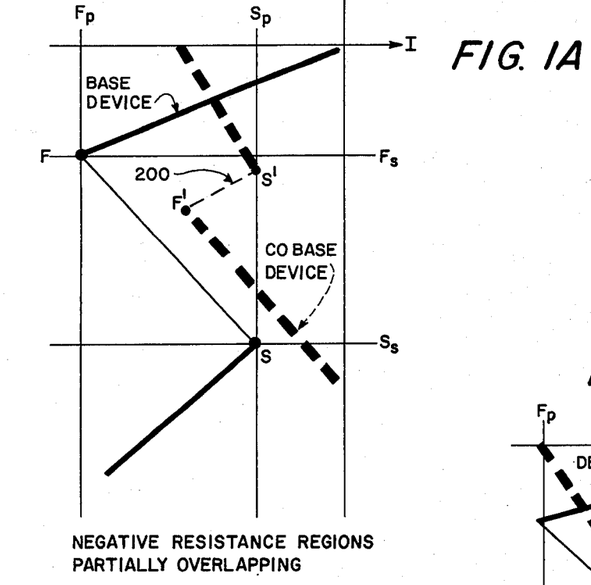
FIG. 1a graphically illustrates load line analysis of two S-type negative-resistance devices.
Figure 1B:
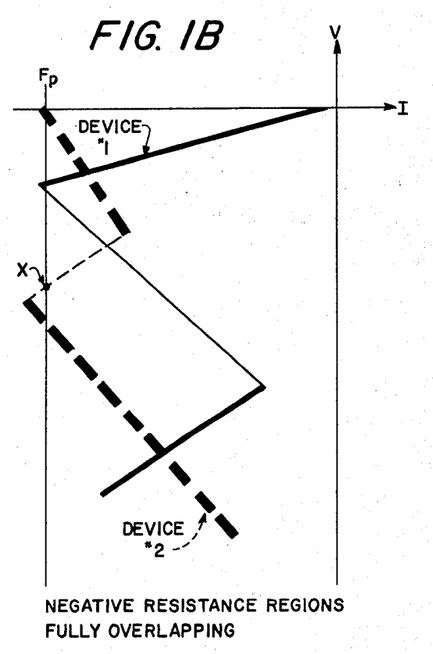
FIGS. 1b, 1c, and 1d graphically illustrate in detail interaction between two S-type negative-resistance devices.
Figures 1C, 1D:
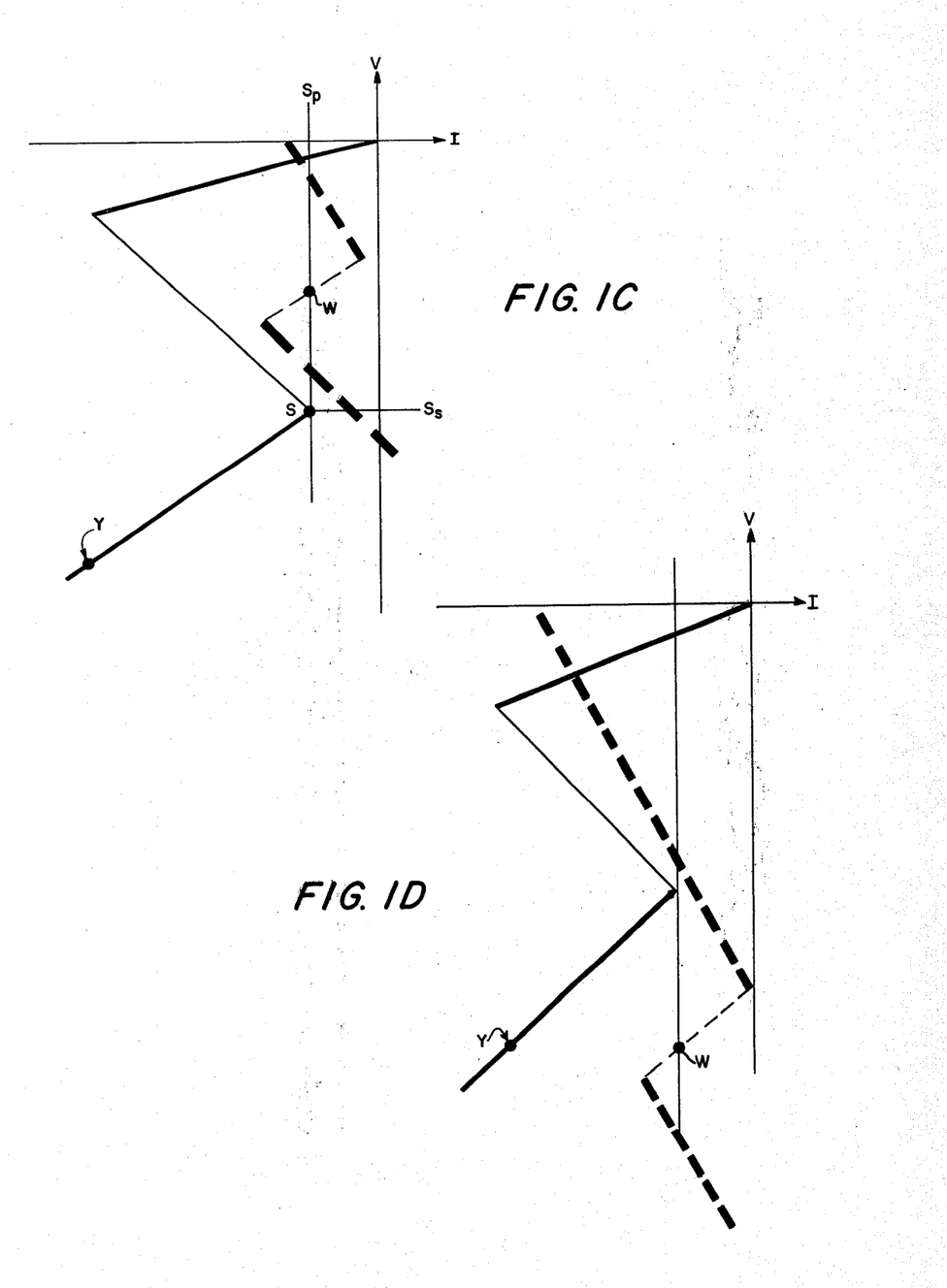

A typical operating characteristic for a negative-resistance composite device is depicted in FIG. 1. The represented composite device is formed by two "elemental" devices. These two elemental devices are both S-type negtive-resistance devices in this described embodiment. The first device is, for analysis purposes, termed the "base device" and has an operating characteristic depicted as a solid line in FIG. 1. In the FIGS., reference numbers or letters associated with the base device will always be unprimed. The second device is, also for analysis purposes, termed the "cobase device" and is depicted in FIG. 1 as having the dashed characteristic. This cobase device acts as a "load" for the base device and it is their interactive cooperation that makes available extra stable states. In the FIGS., reference number or letters associated with the cobase device will always be primed.

In considering operation of these devices well known load-line analysis is utilized. An independent variable is chosen—such as current—and the effect of the base device on the associated dependent variable (i.e., voltage in this case) is plotted. Also, in accordance with the load-line analysis technique, the effect of the load (cobase device) is plotted so that its operating characteristic is of opposite sense to the base device, i.e., in the base device a positive-resistance region would be represented by a positive slope (and a negative resistance by a negative slope), while a positive-resistance region in the cobase device is represented by a negative slope (and a negative-resistance region by a positive slope). I have defined the point on the load line analysis plots where a change from negative resistance to positive resistance occurs as a "state transition point" or simply "transition point". Each state transition point has coresponding coordiante values of independent and dependent variables. I have further defined a transition point existing on the base device characteristic as a "base transition point", and the transition point on the transition point on the cobase device characteristic as a "cobase transition point". Also, I have defined a transition from a positive-resistance region to a negative-resistance region as a "first-order" transition, and a transition from a negative-resistance region to a positive-resistance region as a "second order" transition.

In FIG. 1a, the base device characteristic is shown having, in the region of concern, both a first order base transition point F and a second order base transition point S. The independent coordinate value associated with a first order transition point, I have termed the first order primal value (denoted as $F_p$) while I have termed the coordinate value of the corresponding dependent variable the first order secondary value (denoted as $F_s$). Similarly, I have termed the independent coordinate value associated with a second order transition point the second order primal value (denoted as $S_p$) and the corresponding value of dependent variable the second order secondary value (denoted as $S_s$). I have termed the negative-resistance region on an operating or load-line characteristic between a first order transition point and a second order transition point the negative-resistance sector.

The cobase device characteristic is shown having both a first order cobase transition point F' and a second order cobase transition point S'.

Figure 4:
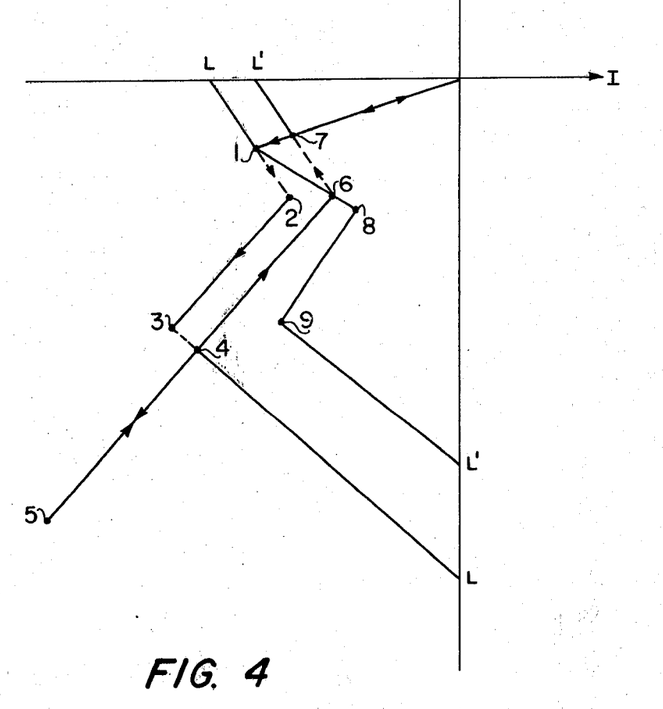
FIG. 4 indicates in detail a quadristable characteristic of two S-type interactive devices showing the switching sequence.
Figure 7:
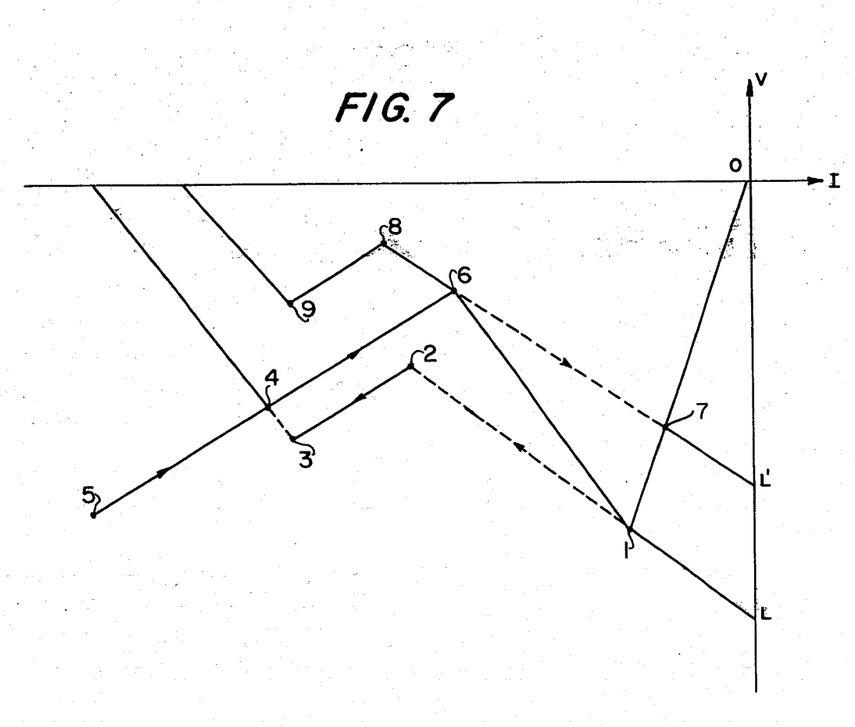
FIG. 7 indicates in detail a quadristable characteristic of two N-type interactive devices showing the switching sequence.

In the load-line analysis FIGS. 1, 4, and 7, the cobase device is depicted as operating at one particular bias level. As is well-known in load-line analysis, as the bias level (or condition) of the cobase elemental device is varied, its operating characteristic is shifted. For example, the cobase characteristic in FIG. 1a will be shifted to the left with increased current bias, and to the right with decreased current bias.

In contrast, the technique of the present invention causes negative-resistance regions of at least two elemental devices to cooperatively interact in order to produce additional stable states. A cobase device is selected (or is modified by addition of resistances in series and/or parallel with it) and biased to have a negative-resistance sector 200 located so as to intersect (at a point X in FIG. 1b) the first order primary current value $F_p$, and further to have the intersection point X between the first order transition point $F_p$ and a point less negative than any possible intersection point Y between the first order current value and a subsequent positive base resistance region Z. Establishing this interactive characteristic provides a stable state which heretofore has not been considered. Whether or not the chosen cobase characteristic and bias will yield still an additional stable state depends further upon location of the intersection point W of the cobase negative-resistance region 200 with the second order primary value $S_p$ (current). If, as depicted in FIG. 1c, the intersection point W is less negative (i.e., closer to the origin) than the base second order secondary value (voltage), then a second stable interactive state will obtain from the cobase negative-resistance region. On the other hand, if, as depicted in FIG. 1d, the intersection point W is more negative than the base second order secondary value, no second stable interactive state occurs.

It is important to note that the additional stable state region cannot obtain if the base first order primary value intersects the cobase negative-resistance region at a point less negative than secondary value or if the intersection occurs at a point more negative than the intersection point of a following positive-resistance region with the first order secondary value.

To state in another way the conditions under which negative-resistance interaction in accordance with the present invention occurs, a device having a negative-resistance V-I characteristic is used as a load for another negative-resistance device. The devices may be in series or parallel connection. By proper manipulation of circuit parameters such as bias and resistance values (a manipulation well within the competence of one skilled in the art), the negative-resistance segments of the characteristics of the two devices are made to intersect, or overlap. This intersection results in additional stable states not present when the composite circuit is not operated in this interactive mode.

It will be obvious to one skilled in the electronics art, after comprehending the principles of my invention, that many such elemental devices can be combined by simply extending the fundamental teachings of my invention. Thus by applying the principles of my invention to combine a number $m$ of elemental devices, then a composite device having a minimum of $(m+1) + [(m-1)!]$ stable states is achievable.

FIG. 4 shows the interaction of an S-type negative resistance with an S-type negative resistance load. The device characteristic is represented by the line extending between points 0-1-6-5. The load at the first switching point 1 is given by negative resistance L-L. Switching occurs along this line, namely, from 1-2-3-4, where the line 2-3 is an additional stable state. As the device characteristic is further traversed at higher negative voltages by the load, the operating point proceeds from 4-5, returning along this line to point 6 as the sweep voltage decreases. Switching occurs along the line L'L', namely from point 6-7, from which the operating point returns to the origin as the sweep voltage goes to zero.

FIG. 7 shows the interaction of an idealized, N-type, avalanche negative resistance, represented by line 0-1-6-5, with an N-type negative-resistance load. Switching occurs along segments 1-2-3-4. Segment 2-3 is stable and segments 1-2 and 3-4 are unstable. As the base N-type negative resistance is further traversed by the load, the operating point proceeds from 4-5. On the return sweep, it goes to 6 via 4. At point 6, switching occurs to point 7. From this point on, the operating point returns monotonically to the origin along 7-0 as the sweep voltage is reduced to 0.

In fabricating multiavalanche negative-resistance devices for use in the preferred embodiment of the present invention, three-quarter inch diameter commercially obtained silicon wafers were used to form elements on a common substrate. Three epitaxial layers were grown on [100] silicon to provide a total four regions [PNPN] following which the top and bottom surfaces were plated (by evaporation) with a gold film to give an overall thickness of approximately 0.002 mils.

Silicon PNPN slices with 20 volt breakover characteristics were employed for monolithic fabrication of up to 200 individual devices on a common substrate. Resulting devices were made in various areas, 2 mils square to 8 mils square, and in various configurations and spaces. Each new device had essentially the same breakover voltage as its large area counterpart The composite structures were mounted in a 14 lead flat package. To do so the common cathode structure was bonded to the insulating header substrate; the common cathode and the anodes were individually thermocompression-bonded to the header pins with 2 mil gold wire.

These experimental arrays of PNPN diodes, fabricated by a combination of diffusion and epitaxial growth techniques with H-geometry on a common substrate, were operated multistably.

Integrated tunnel diodes utilized in the alternate embodiment of the present invention were fabricated on a common substrate from a 10 mil slice of [100] germanium doped with $10^{19}$ donors per cc, having a resistivity of 0.0007 ohm-cm was scribed into 20 mil squared dice. the anodes were made of indium pellets from 0.5 to 3 mils in diameter. The pellets were alloyed into the germanium substrate by quadruple-focused infrared sources uner vacuum of approximately 50 microns at a temperature of 300° C for approximately 10 seconds. The process produced multiple tunnel diodes with an average peak current and peak-to-valley of 7:1. From the large yield of diodes on the germanium substrate, seven were selected with similar characteristics. The base material was connected to the header which served as a cathode. Anode connections were made by compression-bonding with 2 mil gold wire to the alloyed indium pellets which served as anodes. Although diodes of similar characteristics were selected, it was necessary to employ a variable resistor across each diode to compensate for individual variations in their characteristics.

By device design or electrical modification of device characteristics, the value of a negative resistance and the spacing between stable states can be varied to accommodate triggering, provide desired output focus levels, or result in operation in several digital and analog modes.

the semiconductor junction devices employed lend themselves effectively to monolithic array integration utilizing integrated circuit technology. The isolation that is provided electrically offers the advantage over conventional isolation techniques in that no additional processing steps are required.

The utilization of multistable devices and integrated circuits of the present invention offer a number of advantages. With such technology it is possible to achieve appreciable circuit simplicity, higher circuit density, increased reliability, and reduced cost over conventional circuitry for many useful applications. The multistable building blocks used to accomplish this service as the basis for multifrequency oscillators, variable gain amplifiers, variable frequency multipliers and dividers, dense memory storage, and other analog and digital function with radices higher than binary which are capable of electrical and optical excitation, triggering and readout. It is important to understand that the concept of additional stable states as discussed above is not limited merely to electronic devices. It is applicable to any physical embodiment possessing the same essential analogous physical behavioral characteristics as that typically exhibited by devices described above. In other words, the technique of the present invention utilizes any combination of device which exhibits behavior characteristic in which separate but overlapping and interacting negative-resistance.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A composite multistate device comprising:
    a first elemental negative resistance device having at least one negative resistance region occurring on a load line operating between positive resistance regions, when the load line is plotted as the circuit characteristic on a graph having voltage and current as independent and dependent variables;
    a second elemental negative resistance device of the same type as said first elemental device coupled to said first device and having at least one negative resistance region occurring between positive resistance regions, and further wherein said second device negative resistance region is adjusted to occur so as to intersect the value of the independent variable of said first device load-line operating characteristic at a transition point occurring when said first device is changing from a positive to a negative resistance region when the magnitude of the independent variable is increasing and further wherein said second device negative resistance region occurs so that said intersection is at a value more negative than the value of the dependent variable at said transition point but further wherein said second device negative resistance region occurs so that said intersection is at a value less negative than a second intersection, if any, of said value of said independent variable at said transition point with said second positive resistance region of said first device,
    whereby said composite multistate device will exhibit an additional stable state arising from stable operation in said negative resistance region of said second device interactively operating in the negative resistance region of said first device.

2. The composite multistable device of claim 1 wherein said second device negative resistance region is adjusted to occur so as to intersect the value of the independent variable of said first device load-line operating characteristic at a second transition point occurring when said first device is changing from a positive resistance region to a negative resistance region when the magnitude of the independent variable is decreasing, and further wherein said second device negative resistance region occurs so that said intersection at said second transition point is at a value less negative then the value of the dependent variable at said second intersection point but further wherein said second device negative resistance region occurs so that said second intersection is at a value more negative than the intersection of said value of said independent variable at said second transition point with said first positive resistance region of said first device,
    whereby said composite multistate device will exhibit an additional stable state arising from stable operation in the negative resistance region of said second device interactively operating in the negative resistance region of said first device.

3. The composite multistate device of claim 1 wherein each said elemental negative resistance device is of S-type and further wherein said elemental devices are connected in series.

4. The composite multistate device of claim 1 wherein each said elemental device is of N-type and further wherein said elemental devices are connected in parallel.

5. The composite multistable device of claim 1 wherein said adjustment of said device in order to cause said negative resistance regions to occur at desired positions.

6. A composite multistate device comprising, in combination:
    a first negative-resistance device which exhibits on its voltage-current characteristic curve a negative-resistance segment between two positive-resistance segments; and
    a second negative-resistance device having a characteristic curve similar to that of the first,
    said second device being connected as a load for the first device, the values of the circuit parameters being adjusted to cause said negative-resistance segments of the characteristic curves to intersect so that the devices operate interactively and produce one or more stable states in addition to those which would be produced if the devices were not operating in an interacting mode.

7. The composite device of claim 6, wherein said first and second devices are connected in series circuit.

8. The composite device of claim 6, wherein said first and second devices are connected in parallel circuit.

9. The composite device of claim 6, wherein the circuit prameters which are adjusted include the bias of at least one of the negative-resistance devices.

10. The composite device of claim 6, wherein the minimum number of stable states of the composite device is $(M+1) + (M-1)!$, M being the number of negative-resistance devices in the composite device.

11. The composite device of claim 6, further including at least one more negative-resistance device, the values of the parameters of the circuit being such that all negative-resistance segments of the devices intersect, whereby all the devices will operate interactively.

* * * * *